(12) United States Patent
Lee et al.

(10) Patent No.: US 10,049,916 B2
(45) Date of Patent: Aug. 14, 2018

(54) METHOD OF MANUFACTURING A GERMANIUM-ON-INSULATOR SUBSTRATE

(71) Applicants: Massachusetts Institute of Technology, Cambridge, MA (US); Nanyang Technological University, Singapore (SG)

(72) Inventors: Kwang Hong Lee, Singapore (SG); Chuan Seng Tan, Singapore (SG); Yew Heng Tan, Singapore (SG); Gang Yih Chong, Singapore (SG); Eugene A. Fitzgerald, Cambridge, MA (US); Shuyu Bao, Singapore (SG)

(73) Assignees: Massachusetts Institute of Technology, Cambridge, MA (US); Nanyang Technological University, Singapore (SG)

( * ) Notice: Subject to any disclaimer, the term of this patent is extended or adjusted under 35 U.S.C. 154(b) by 44 days.

(21) Appl. No.: 15/309,989

(22) PCT Filed: May 22, 2015

(86) PCT No.: PCT/SG2015/050121
§ 371 (c)(1),
(2) Date: Nov. 9, 2016

(87) PCT Pub. No.: WO2015/178857
PCT Pub. Date: Nov. 26, 2015

(65) Prior Publication Data
US 2017/0271201 A1    Sep. 21, 2017

Related U.S. Application Data

(60) Provisional application No. 62/002,331, filed on May 23, 2014.

(51) Int. Cl.
*H01L 21/71* (2006.01)
*H01L 21/762* (2006.01)
(Continued)

(52) U.S. Cl.
CPC .... *H01L 21/76256* (2013.01); *H01L 21/0228* (2013.01); *H01L 21/02057* (2013.01);
(Continued)

(58) Field of Classification Search
CPC ......... H01L 21/76251; H01L 21/76256; H01L 21/02057; H01L 21/0228
See application file for complete search history.

(56) References Cited

U.S. PATENT DOCUMENTS 6,881,650 B2 * 4/2005 Lee ................... H01L 21/76254
                                                       257/E21.568
7,445,977 B2 * 11/2008 Chu ................... H01L 21/76254
                                                       257/E21.129
(Continued)

FOREIGN PATENT DOCUMENTS

| JP | H10-256169 A | 9/1998 |
| JP | 2008198656 A | 8/2008 |
| WO | 2006031247 A2 | 3/2006 |

OTHER PUBLICATIONS

International Search Report for Application No. PCT/SG2015/050121 dated Sep. 1, 2015.
(Continued)

*Primary Examiner* — Andres Munoz
(74) *Attorney, Agent, or Firm* — Lerner, David, Littenberg, Krumholz & Mentlik, LLP

(57) ABSTRACT

A method of manufacturing a germanium-on-insulator substrate is disclosed. The method comprises: providing (102) a first semiconductor substrate, and a second semiconductor substrate formed with a germanium layer; bonding (102) the
(Continued)

first semiconductor substrate to the second semiconductor substrate using at least one dielectric material to form a combined substrate, the germanium layer being arranged intermediate the first and second semiconductor substrates; removing (104) the second semiconductor substrate from the combined substrate to expose at least a portion of the germanium layer with misfit dislocations; and annealing (106) the combined substrate to enable removal of the misfit dislocations from the portion of the germanium layer.

19 Claims, 7 Drawing Sheets

(51) Int. Cl.
  *H01L 21/324* (2006.01)
  *H01L 21/02* (2006.01)
  *H01L 21/306* (2006.01)

(52) U.S. Cl.
  CPC .. *H01L 21/02532* (2013.01); *H01L 21/30604* (2013.01); *H01L 21/30625* (2013.01); *H01L 21/3247* (2013.01); *H01L 21/02112* (2013.01); *H01L 21/02115* (2013.01); *H01L 21/02164* (2013.01); *H01L 21/02178* (2013.01)

(56) References Cited

U.S. PATENT DOCUMENTS

| | | | | |
|---|---|---|---|---|
| 7,449,394 B2* | 11/2008 | Akatsu | ............... | H01L 21/76254 257/E21.568 |
| 7,767,541 B2 | 8/2010 | Cheng et al. | | |
| 8,088,672 B2* | 1/2012 | Lee | ................... | H01L 21/76254 257/E21.12 |
| 9,716,029 B2* | 7/2017 | Lallement | ......... | H01L 21/76254 |
| 2002/0072243 A1* | 6/2002 | Craighead | ......... | B01L 3/502707 438/745 |
| 2002/0190269 A1 | 12/2002 | Atwater et al. | | |
| 2004/0137698 A1* | 7/2004 | Taraschi | ............ | H01L 21/30604 438/458 |
| 2005/0067377 A1 | 3/2005 | Lei et al. | | |
| 2005/0191852 A1* | 9/2005 | Takigawa | ............ | H01L 21/0332 438/637 |
| 2006/0014366 A1* | 1/2006 | Currie | ............... | H01L 21/76254 438/517 |
| 2007/0032043 A1* | 2/2007 | Endo | ...................... | H01L 21/322 438/459 |
| 2008/0194078 A1 | 8/2008 | Akiyama et al. | | |
| 2008/0268615 A1* | 10/2008 | Allibert | ............. | H01L 21/76254 438/455 |
| 2015/0021784 A1* | 1/2015 | Lin | ........................ | H01L 23/481 257/774 |

OTHER PUBLICATIONS

"The International Technology Roadmap for Semiconductor" www.itrs.net.

A. Nayfeh et al., "Effects of hydrogen annealing on heteroepitaxial-Ge layers on Si: Surface roughness and electrical quality", Applied Physics Letters, Oct. 2004, vol. 85, No. 14, pp. 2815-2817.

D. Choi et al., "Low surface roughness and threading dislocation density Ge growth on Si (0 01)", Journal of Crystal Growth 310, Jul. 2008, pp. 4273-4279.

D. H. Kim et al., "30 nm E-mode InAs PHEMTs for THz and Future Logic Applications", IEEE International Electron Devices Meeting, 2008, 719.

D. H. Kim et al., "Scaling Behavior of In0.7Ga0.3As HEMTs for Logic", IEEE International Electron Devices Meeting, 2006, vol. 1, 587.

G. Dewey et al., "Carrier Transport in High-Mobility III-V Quantum-Well Transistors and Performance Impact for High-Speed Low-Power Logic Applications", IEEE Electron Device Letters, Oct. 2008, vol. 29, No. 10, pp. 1094-1097.

H. C. Luan et al., "High-quality Ge epilayers on Si with low threading-dislocation densities" Applied Physics Letters, Nov. 1999, vol. 75, No. 19, pp. 2909-2911.

J. M. Hartmann et al., "Reduced pressure-chemical vapor deposition of Ge thick layers on Si(001) for 1.3-1.55-m photodetection", Journal of Applied Physics, 2004, vol. 95, pp. 5905-5913.

J. Oh et al., "Metal-Germanium-Metal Photodetectors on Heteroepitaxial Ge-on-Si With Amorphous Ge Schottky Barrier Enhancement Layers", IEEE Photonics Technology Letters, Feb. 2004, vol. 16, No. 2, pp. 581-583.

J S.Park et al., "Growth of Ge Thick Layers on Si(001) Substrates Using Reduced Pressure Chemical Vapor Deposition", Japanese Journal of Applied Physics, 2006, vol. 45, No. 11, pp. 8581-8585.

K H. Lee et al., "Comparative Studies of the Growth and Characterization of Germanium Epitaxial Film on Silicon (001) with 0° and 6° Offcut", Journal of Electronic Materials, 2013, vol. 42, No. 6, pp. 1133-1139.

L. Colace et al., "Metal-semiconductor-metal near-infrared light detector based on epitaxial Ge/Si", Applied Physics Letters 72, 1998, pp. 3175-3177.

M. E. Groenert et al., "Monolithic integration of room-temperature cw GaAs/AlGaAs lasers on Si substrates via relaxed graded GeSi buffer layers", Journal of Applied Physics, Jan. 2003, vol. 93, No. 1, 362.

M. Passlack et al., "High Mobility III-V MOSFETs For RF and Digital Applications", IEEE International Electron Devices Meeting, 2007, vol. 1, pp. 621-624.

M. Radosavljevic et al., "High-Performance 40nm Gate Length InSb P-Channel Compressively Strained Quantum Well Field Effect Transistors for Low-Power (VCC=0.5V) Logic Applications", IEEE International Electron Devices Meeting, 2008, 727.

M. T. Currie et al., "Controlling threading dislocation densities in Ge on Si using graded SiGe layers and chemical-mechanical polishing", Applied Physics Letters, Apr. 1998, vol. 72, No. 14, pp. 1718-1720.

M.M. Oye et al., "Molecular-beam epitaxy growth of device-compatible GaAs on silicon substrates with thin ( 80 nm ) Si 1 x Ge x step-graded buffer layers for high-III-V metal-oxidesemiconductor field effect transistor applications", Journal of Vacuum Science and Technology B, Jun. 2007, vol. 25, No. 3, pp. 1098-1102.

R. M. Sieg et al., "Toward device-quality GaAs growth by molecular beam epitaxy on offcut Ge/Si 1x Ge x/Si substrates", Journal of Vacuum Science & Technology B, North American Conference on Molecular-Beam Epitaxy, Jun. 1998, vol. 16, No. 3, pp. 1471.

S. Deleonibus, "Physical and technical limitations of NanoCMOS devices to the end of the roadmap and beyond" The European Physical Journal Applied Physics, 2007, vol. 36, pp. 197-214.

S. Fama et al., "High performance germanium-on-silicon detectors for optical communications", Applied Physics Letters, Jul. 2002, vol. 81, No. 4, pp. 586-588.

S. Luryi et al., "New Infrared Detector on a Silicon Chip", IEEE Transactions on Electron Devices, Sep. 1984, vol. ED-31, No. 9, pp. 1135-1139.

T. A. Langdo et al., "High quality Ge on Si by epitaxial necking", Applied Physics Letters, Jun. 2000, vol. 76, No. 25.

V. K. Yang et al., "Monolithic integration of III-V optical interconnects on Si using SiGe virtual substrates", Journal of Materials Science: Materials in Electronics, vol. 13, 2002, pp. 377-380.

Y. H. Tan et al.,"Growth and characterization of germanium epitaxial film on silicon (001) using reduced pressure chemical vapor deposition", Thin Solid Films, 520, 2012, pp. 2711-2716.

Y. Sun et al., "Scaling of In0.7Ga0.3As Buried-Channel MOSFETs", IEEE International Electron Devices Meeting, (2008), 367.

Y. Xuan et al., "High-performance Surface Channel In-rich In0. 75Ga0.25As MOSFETs with ALD High-k as Gate Dielectric", IEEE International Electron Devices Meeting, (2008), 371.

Z. Cheng et al., "Relaxed Silicon-Germanium On Insulator (SGOI)", Mat. Res. Soc. Symp. Proc., 2002, vol. 686.

* cited by examiner (a)

(b)

500

(a)

550

(b)

METHOD OF MANUFACTURING A GERMANIUM-ON-INSULATOR SUBSTRATE

CROSS REFERENCE TO RELATED APPLICATIONS

The present application is a national phase entry under 35 U.S.C. § 371 of International Application No. PCT/SG2015/050121, filed May 22, 2015, published in English, which claims the benefit of the filing date of U.S. Provisional Patent Application No. 62/002,331, filed May 23, 2014, the disclosures of which are incorporated by reference herein.

FIELD & BACKGROUND

The present invention relates to a method of manufacturing a germanium-on-insulator substrate.

For the last few decades, rigorous scaling methods have been driving the silicon (Si) complementary metal-oxide-semiconductor (CMOS) technology to enhance device performance, lower the associated power consumption required, and reduce manufacturing costs per transistor. As device dimension shrinks and progresses to closer to the scaling limit, a paradigm shift has occurred in the industry from focusing only on dimensional scaling alone to actively exploring materials innovation ("performance boosters"). One such example is the III-V compound materials due to their unique properties for potential future high speed and low power computation applications. Compared to Si, III-V materials tend to display 20-70 times higher electron mobility and approximately 20 times higher conductivity. In addition, the feasibility of energy bandgap engineering of III-V materials enables fabrication of devices suitable for communications and optoelectronics. However, III-V materials cannot completely replace Si because III-V substrates are very costly and smaller in size due to their brittle materials properties (usually smaller or equal to 200 mm). Therefore, to get around the problem, small quantity of III-V materials has to be integrated with Si substrates to be compatible with mainstream CMOS manufacturing. In order to realize III-V materials integration on low cost and provide mechanically strong Si substrates, a number of research groups have investigated III-V growth on Si for optoelectronics and microelectronics applications.

One challenge in producing high quality III-V materials on Si suitable for manufacturing compatibility with existing CMOS technology is the large lattice mismatch between the two materials (e.g. in the case of GaAs, the mismatch is about 4.1%). So to resolve the problem, germanium (Ge), which has a lattice constant that is almost perfectly matched to GaAs (0.07% mismatch at 300 K) and has superior electron and hole mobility compared to Si, may be grown on Si to provide a buffer layer for integration and fabrication of GaAs based devices on Si substrate. Another possible solution is to form Germanium-on-Insulator (GOI) substrate for the same application above. Besides acting as a "passive" buffer layer, Ge on Si or GOI substrates (with no III-V layers) also have applications in advanced CMOS circuit and photonics.

Conventional solutions have reported on high quality of Ge epitaxial layer grown on Si with threading dislocation density (TDD) of approximately $10^5$ cm$^{-2}$ but it however requires growing a thick (about 10 μm) graded SiGe buffer layer. Another approach is to deposit Ge directly on a Si substrate and then introduce an annealing step during and after the Ge growth to reduce TDD. The techniques involve using a two-step low temperature/high temperature (LT/HT) Ge growth and also via other combinations. However, these methods result in a much higher TDD of greater than $10^7$ cm$^{-2}$. In particular, the high TDD level may degrade any subsequent III-V materials integration, and may also further undesirably lead to device failure.

One object of the present invention is therefore to address at least one of the problems of the prior art and/or to provide a choice that is useful in the art.

SUMMARY

According to a 1$^{st}$ aspect of the invention, there is provided a method of manufacturing a germanium-on-insulator substrate, comprising: (i) providing a first semiconductor substrate, and a second semiconductor substrate formed with a germanium layer; (ii) bonding the first semiconductor substrate to the second semiconductor substrate using at least one dielectric material to form a combined substrate, the germanium layer being arranged intermediate the first and second semiconductor substrates; (iii) removing the second semiconductor substrate from the combined substrate to expose at least a portion of the germanium layer with misfit dislocations; and (iv) annealing the combined substrate to enable removal of the misfit dislocations from the portion of the germanium layer.

Advantageously, the method allows hidden misfit dislocations inherently present along an interface between the second semiconductor substrate and germanium layer to be exposed to enable the misfit dislocations to be repaired/removed. This beneficially lowers the TDD of the GOI substrate manufactured using the proposed method to about $2.5 \times 10^6$ cm$^{-2}$ which is at least an order of magnitude lower than conventional techniques used to manufacture similar substrates.

Preferably, the method may further comprise depositing the dielectric material respectively to the first and second semiconductor substrates prior to the bonding, wherein the dielectric material is deposited on the germanium layer for the second semiconductor substrate. The depositing may be performed using atomic layer deposition (for the Al$_2$O$_3$), while plasma-enhanced chemical vapour deposition (PECVD) or other chemical vapour deposition (CVD) may be used to deposit SiO$_2$, SiN, AlN or other types of dielectrics. In addition, physical vapour deposition, spin coating or the like processes may also be usable.

Preferably, prior to the bonding, the method may further comprise performing plasma activation on the first and second semiconductor substrates; washing the cleaned first and second semiconductor substrates with a deionized fluid; and drying the washed first and second semiconductor substrates.

Preferably, the deionized fluid may be deionized water.

Preferably, drying the washed first and second semiconductor substrates may include using spin-drying.

Preferably, prior to removing the second semiconductor substrate from the combined substrate, the method may further comprise annealing the combined substrate to increase the bonding between the first and second semiconductor substrates.

Preferably, annealing the combined substrate to increase the bonding strength may include performing the annealing using nitrogen at a temperature of about 300° C. and at atmosphere pressure.

Preferably, the dielectric material may be selected from the group consisting of aluminium oxide, aluminium nitrate, silicon dioxide, synthetic diamond and boron nitride.

Preferably, the first and second semiconductor substrates may respectively be formed from silicon-based materials.

Preferably, the annealing may be performed at a temperature between about 500° C. to 850° C. The annealing here similarly refers to annealing the combined substrate at step (iv).

Preferably, the annealing may be performed using a gas selected from the group consisting of oxygen, hydrogen, nitrogen, and argon.

Preferably, the method may further comprise: depositing a layer of protective material on the first semiconductor substrate, prior to removing the second semiconductor substrate from the combined substrate.

Preferably, the protective material may be ProTEK®B3-25, silicon dioxide or silicon nitride.

Preferably, subsequent to annealing the combined substrate, the method may further comprise etching the combined substrate to remove a layer of material formed on the portion of the germanium layer as a result of the annealing to enable removal of the misfit dislocations from the portion of the germanium layer, wherein the layer of material substantially includes the misfit dislocations.

Preferably, etching the combined substrate may include using wet etching or dry etching.

Preferably, wet etching may include using an etchant to remove the layer of material formed on the portion of the germanium layer, and the etchant may include hydrofluoric acid.

Preferably, wherein removing the second semiconductor substrate from the combined substrate may comprise: arranging the combined substrate to be in a solution of tetramethylammonium hydroxide to remove the second semiconductor substrate; and performing etch-stopping on the exposed portion of the germanium layer.

Preferably, the solution may be heated to a temperature of about 80° C.

Preferably, the method may further comprise removing the protective material from the first semiconductor substrate using oxygen plasma configured with a power of about 800 W.

Preferably, removing the second semiconductor substrate from the combined substrate may comprise using a combination of mechanical grinding and wet etching to remove the second semiconductor substrate.

Preferably, the method may further comprise depositing the germanium layer on the second semiconductor substrate, prior to the bonding.

Preferably, the at least one dielectric material may include at least first and second dielectric materials, the first dielectric material being deposited on the first semiconductor substrate, and the second dielectric material being deposited on the germanium layer for the second semiconductor substrate, and wherein the first dielectric material is different to the second dielectric material.

Preferably, the method may further comprise forming a further dielectric material on the portion of the germanium layer, subsequent to removing the second semiconductor substrate, and prior to annealing the combined substrate.

According to a $2^{nd}$ aspect of the invention, there is provided a method of manufacturing a germanium-based substrate, comprising: (i) providing a first semiconductor substrate, and a second semiconductor substrate formed with a germanium layer; (ii) bonding the first semiconductor substrate to the second semiconductor substrate using at least one bonding material to form a combined substrate, the germanium layer being arranged intermediate the first and second semiconductor substrates; (iii) removing the second semiconductor substrate from the combined substrate to expose at least a portion of the germanium layer with misfit dislocations; and (iv) annealing the combined substrate to enable removal of the misfit dislocations from the portion of the germanium layer.

Preferably, the bonding material may include a dielectric material, a non-dielectric material, a plurality of different non-dielectric materials, or a plurality of different dielectric materials.

It should be apparent that features relating to one aspect of the invention may also be applicable to the other aspects of the invention.

These and other aspects of the invention will be apparent from and elucidated with reference to the embodiments described hereinafter.

BRIEF DESCRIPTION OF THE DRAWINGS

Embodiments of the invention are disclosed hereinafter with reference to the accompanying drawings, in which:

FIG. 7 includes FIGS. 7a and 7b, which are respectively an image of Raman spectroscopy of the alloy composition and the strain of the germanium epilayers on the GOI substrate prior and subsequent to annealing with reference to bulk germanium, and an enlarged image of the Ge—Ge vibration peak in FIG. 7a.

DETAILED DESCRIPTION OF PREFERRED EMBODIMENTS

Figure 1:
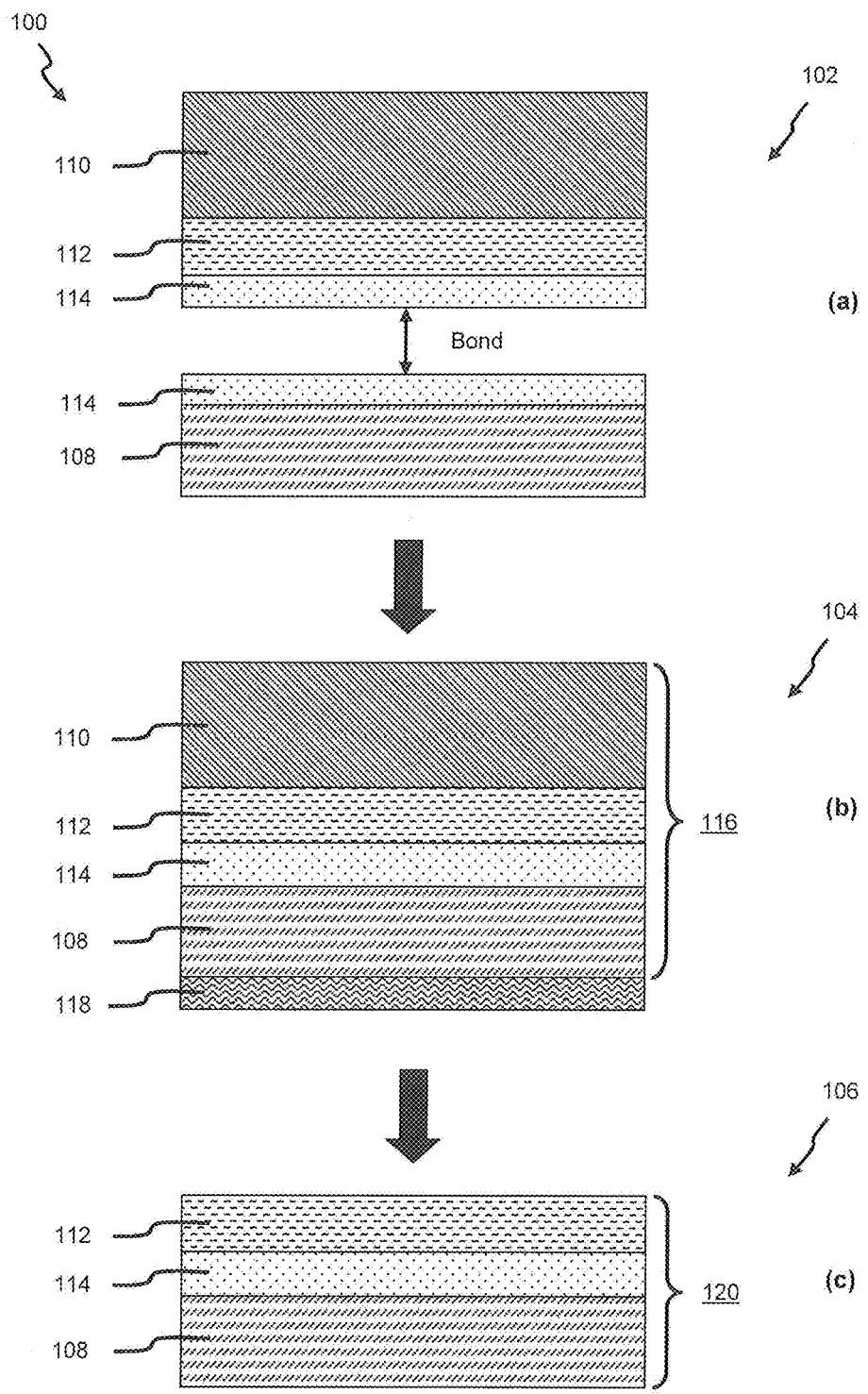
FIG. 1 includes FIGS. 1a to 1c, which depict steps of a method of manufacturing a germanium-on-insulator (GOI) substrate, according to an embodiment.

FIGS. 1a to 1c illustrate steps of a proposed method 100 of manufacturing a germanium-on-insulator (GOI) substrate, according to an embodiment. At step 102, a first semiconductor substrate 108, and a second semiconductor substrate 110 formed with a germanium (epitaxial) layer 112 are provided. Then, in the same step 102, the first semiconductor substrate 108 is bonded to the second semiconductor substrate 110 using at least one dielectric material 114 to form a combined substrate 116 (i.e. see FIG. 1b). In this embodiment, a same dielectric material is used for the dielectric material 114, but not to be construed as limiting. In the combined substrate 116, the germanium layer 112 is arranged intermediate the first and second semiconductor substrates 108, 110. More specifically, the germanium layer 112 is now sandwiched between the layer of dielectric material 114 and the second semiconductor substrate 110. Both the first and second semiconductor substrates 108, 110 are respectively formed from silicon-based materials, and in this instance, the first semiconductor substrate 108 is a silicon acceptor substrate, while the second semiconductor substrate 110 is a silicon donor wafer. The dielectric material 114, which serves as a bonding layer to the first and second semiconductor substrates 108, 110, is selected from the group consisting of aluminium oxide ($Al_2O_3$), aluminium nitride (AlN), silicon dioxide ($SiO_2$), synthetic diamond and boron nitride (BN), although other suitable dielectric materials (with good thermal conductivity and electrical resistivity) are also usable. In this case, the dielectric material 114 is aluminium oxide, which is selected for having a higher thermal conductivity than silicon dioxide (i.e. 30 $Wm^{-1}k^{-1}$ versus 1.4 $Wm^{-1}k^{-1}$). The aluminium oxide thus arranged in the combined substrate 116 may also be viewed as a buried oxide layer.

It is to be appreciated that prior to step 102, a conventional three-step germanium growth process (e.g. reduced-pressure chemical vapour deposition) may be used to grow the germanium layer 112 directly on the second semiconductor substrate 110. A thickness of the germanium layer 112 grown on the second semiconductor substrate 110 may vary as suitably desired, determined by the epitaxy of germanium on silicon, and based on requirements of applications intended for the manufactured GOI substrate. Subsequently, the dielectric material 114 is then deposited (e.g. using atomic layer deposition) on both the first and second semiconductor substrates 108, 110 respectively prior to step 102, wherein for the second semiconductor substrate 110, the dielectric material 114 is deposited on the germanium layer 112. In this instance, a layer of aluminium oxide having thickness of about 10 nm was deposited respectively on the first and second semiconductor substrates 108, 110. It is to be appreciated that a thickness of the layer of dielectric material 114 deposited on the first and second semiconductor substrates 108, 110 may vary (e.g. from tens of nm to several microns) as desired, depending on requirements of applications intended for the manufactured GOI substrate. Thereafter, the first and second semiconductor substrates 108, 110 (now having the deposited layer of dielectric material 114) are plasma activated for about fifteen seconds using an oxygen plasma, rinsed with a deionized fluid (e.g. deionized water) and then substantially dried (e.g. via spin-drying). Specifically, plasma activation is used to clean and rid surfaces of the first and second semiconductor substrates 108, 110 of any hydrocarbon contaminants and to "activate" the said surfaces. It is also to be appreciated that in other embodiments, the duration of the plasma activation may be arranged to be anywhere from three seconds to one min (or possibly even longer, depending on the plasma activation device used). The gas used for the plasma activation may be oxygen, argon, nitrogen, hydrogen or helium. Optionally, the first and second semiconductor substrates 108, 110 may also be treated using UV ozone, instead of using plasma, which still has the same cleaning effect. Step 102 is then carried out.

To prepare for the bonding process at step 102, the first and second semiconductor substrates 108, 110 are then positioned relative to each other such that the respective layers of aluminium oxide directly face each other. That is, the first semiconductor substrate 108 is positioned such that its associated layers 114, 108 are now accordingly re-orientated to the following manner (described from a top-down perspective as per FIG. 1a): the dielectric material 114, and the first semiconductor substrate 108. Similarly, the second semiconductor substrate 110 is positioned such that its associated layers 110, 112, 114 are now accordingly re-orientated to the following manner (described from a top-down perspective as per FIG. 1a): the second semiconductor substrate 110, the germanium layer 112 and the dielectric material 114. In this embodiment, for illustration purpose, the second semiconductor substrate 110 (as a whole) is positioned above the first semiconductor substrate 108 (as a whole), and so, it will be appreciated that the first and second semiconductor substrates 108, 110 are arranged diametrically to each other in this position, shown in FIG. 1a. But to generalise, for step 102, all that is required to form the combined substrate 116 is to bond the first and second semiconductor substrates 108, 110 by bringing the respective layers of aluminium oxide into contact together.

In step 102, the first and second semiconductor substrates 108, 110 are bonded by bringing the respective layers of aluminium oxide thereof into contact to provide the combined substrate 116. Accordingly, the combined substrate 116 comprises the following layers, described in top-down order (based on the arrangement in FIG. 1b): the second semiconductor substrate 110, the germanium layer 112, the dielectric material 114 (e.g. $Al_2O_3$), and the first semiconductor substrate 108. Subsequent to the bonding, the combined substrate is annealed to increase and enhance the bond strength between the first and second semiconductor substrates 108, 110 (through the dielectric material 114). In particular, the annealing is performed (for about three hours) using nitrogen ambient at a temperature of about 300° C. and at atmosphere pressure.

At next step 104, the second semiconductor substrate 110 is removed from the combined substrate 116 to expose at least a portion of the germanium layer 112 with misfit dislocations. The combined substrate 116 without the second semiconductor substrate 110 is hereinafter termed as a final substrate 120 (i.e. see FIG. 1c). The removal effectively exposes the initially hidden misfit dislocations present inherently along an interface between the second semiconductor substrate 110 and germanium layer 112 to enable the misfit dislocations to be repaired or removed. In other words, the term "hidden" here contextually refers to the misfit dislocations which are buried along the said interface by the second semiconductor substrate 110, prior to removal of the second semiconductor substrate 110 at step 104 (which then reveals the previously hidden misfit dislocations). It is to be appreciated that prior to removing the second semiconductor substrate 110 from the combined substrate 116, a layer of protective material 118 (e.g. ProTEK®B3-25, silicon dioxide ($SiO_2$), or silicon nitride (SiN)) may optionally be deposited on the first semiconductor substrate 108. Specifically, the protective material 118 is spin coated on a first surface of the first semiconductor substrate 108, opposing to a second surface on which the dielectric material 114 is deposited, to act as a protection layer during the process of removing the second semiconductor substrate 110. The second semiconductor substrate 110 may be removed from the combined substrate 116 (for example) by submerging the combined substrate 116 into a solution of tetramethylammonium hydroxide (TMAH) heated to about 80° C., and once completed, etch stopping is performed on the exposed portion of the germanium layer 112. Alternatively, in other embodiments, the second semiconductor substrate 110 may be removed using a combination of mechanical grinding and wet etching. It is to be appreciated that the exposed portion of the germanium layer 112 (in this instance) is on a first surface of the germanium layer 112, opposing to a second surface of the germanium layer 112 on which the dielectric material 114 is formed. Before removal of the second semiconductor substrate 110, the first surface of the germanium layer 112 is completely hidden beneath the second semiconductor substrate 110. After the second semiconductor substrate 110 has been completely removed with no existence of bubbles observed, the coating of protective material 118 is then removed from the first semiconductor substrate 108 using oxygen plasma configured with an operating power of about 800 W. Alternatively, the coating of protective material 118 may be removed using acetone instead.

At step 106, the final substrate 120 is annealed to enable removal of the misfit dislocations from the exposed portion of the germanium layer 112. Examples of possible methods that may be used for the annealing include using furnace heating, rapid thermal processing via flash lamps, laser thermal processing, spike annealing and the like. The annealing is performed at a temperature between about 500° C. to 850° C. for four hours. In this case, the final substrate 120 is annealed at a temperature of 850° C. In addition, the annealing is performed using a gas selected from the group consisting of oxygen ($O_2$), hydrogen ($H_2$), nitrogen (N), and argon (Ar), but other types of suitable reactive gases may also be used (depending on circumstances) and not limited to the above options stated. Oxygen is used for the annealing in this embodiment, and so a layer of oxidized germanium consequently forms on the first surface of the germanium layer 112 after the annealing. To clarify, it is to be appreciated that the oxidized germanium layer is no longer crystalline, and thus does not contain the misfit dislocations; rather, through the annealing, the misfit dislocations have been consumed by the oxygen anneal and so the portion of the germanium layer 112 previously with the misfit dislocations now then becomes the oxidized germanium layer. This consequently thus facilitates removal of significant numbers of misfit dislocations in remaining portions of the germanium layer 112 also having misfit dislocations. Particularly, subsequent to the annealing, the final substrate 120 is to be wet (chemically) etched (e.g. for about thirty seconds) using an etchant (e.g. hydrofluoric (HF) acid) to remove the oxidized germanium layer, so that the final substrate 120 may then be further processed for other intended applications/uses. It is however also to be appreciated that dry (plasma) etching may alternatively be used in place of wet etching to remove the oxidized germanium layer, if necessary. The final substrate 120, after step 106 has been completed, may be termed a germanium-on-insulator (GOI) substrate.

It is to be appreciated that for the proposed method 100, only described steps 102, 104, 106 are required as a bare minimum; the other steps are either optional or need not be performed as part of the method 100. Specifically, the proposed method 100 is purposefully devised to enable the repair/removal of misfit dislocations from the germanium layer 112 of the GOI substrate using annealing (e.g. via oxygen) to thereby lower and improve threading dislocation density (TDD). The annealing also removes any silicon from the interface between the second semiconductor substrate 110 and germanium layer 112 through the condensation process. The condensation process is clarified as follows: a thin $Si_{1-x}Ge_x$ layer is formed during the growing of the germanium layer 112 on the second semiconductor substrate 110. Hence, after the second semiconductor substrate 110 is removed, the SiGe layer is now arranged on the germanium layer 112. During the annealing at step 106, germanium from the SiGe layer is rejected by growing a $SiO_2$ layer and condensed into the underlying germanium layer 112. In summary, the method 100 is performed by bonding the first and second semiconductor substrates 108, 110 together with the dielectric material 114 (e.g. using $Al_2O_3$ as a bonding material) and followed by removing the second semiconductor substrate 110 to form the GOI substrate. Hence, the exposed portion(s) of the germanium layer 112 with misfit dislocations may be oxidized using oxygen annealing and the oxidized germanium layer may easily be removed using wet etching. At the same time, the annealing performed at step 106 also helps to reduce the TDD.

Figure 2:
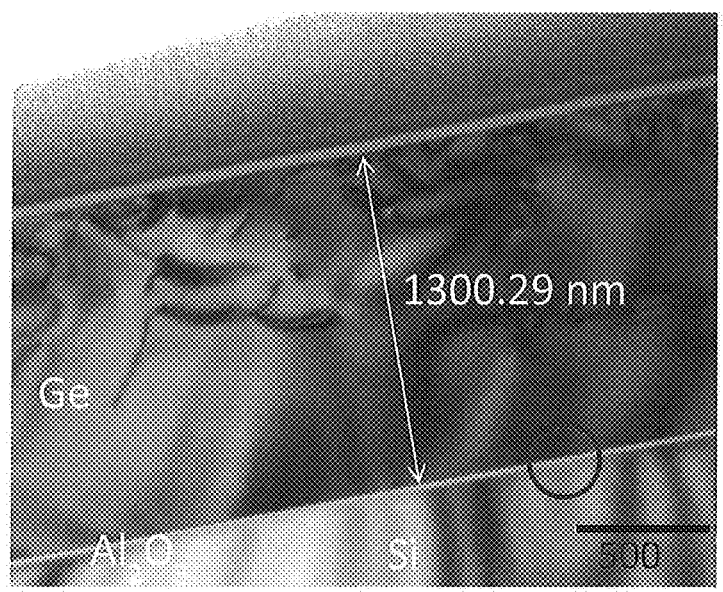
FIG. 2 includes FIGS. 2a and 2b, which are respective cross-sectional Transmission-Electron-Microscopy (TEM) bright field images of the GOI substrate prior to annealing, and the bonding interface between the $Al_2O_3$ layers.
Figure 2:
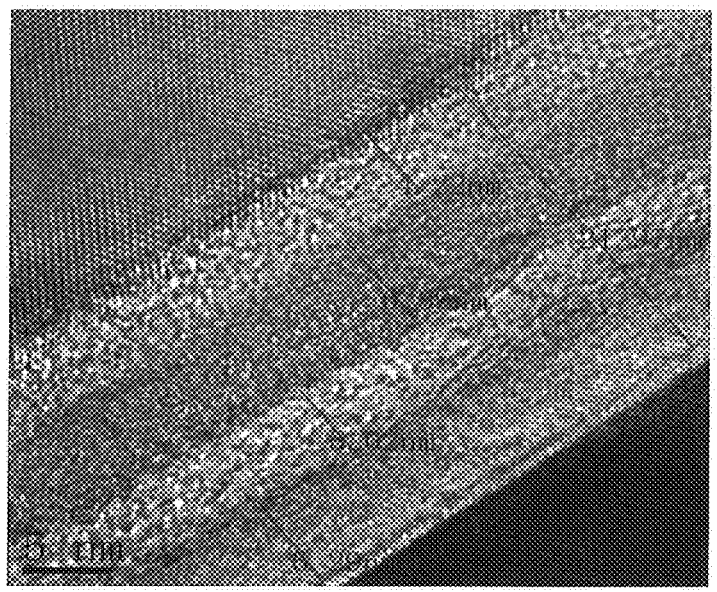

FIGS. 2a and 2b are respective cross-sectional Transmission-Electron-Microscopy (TEM) bright field images 200, 250 of a sample of the GOI substrate prior to annealing, and the bonding interface between the respective $Al_2O_3$ layers (of the first and second semiconductor substrates 108, 110). As seen from FIGS. 2a and 2b, a thickness of the germanium layer 112 and the bonded $Al_2O_3$ layer is about 1300 nm and about 22 nm, respectively. FIG. 2a also shows that the misfit dislocations, which are hidden and confined along the interface between the second semiconductor substrate 110 and germanium layer 112, are now easily accessible via using the proposed method 100, in terms of being exposed for convenient processing after the second semiconductor substrate 110 has been removed. Specifically, this allows the exposed misfit dislocations to be removable by using (for example) chemical mechanical polishing (CMP) or annealing. In addition, the threading dislocations may also consequently be removed once the misfit dislocations are removed. Hence, by way of the using the proposed method 100, a germanium epilayer with lower threading dislocation density (TDD) may be realisable, which is useful for subsequent III-V integration and associated device fabrication. Further as depicted in FIG. 2b, the two respective $Al_2O_3$ layers of the first and second semiconductor substrates 108, 110 are bonded uniformly with no observable microvoids, meaning that a seamless bond at the microscale has been successfully achieved. In addition, a difference in contrast seen within the bonded $Al_2O_3$ layer is due to the $O_2$ plasma activation which modifies the stoichiometry of the $Al_2O_3$.

Figure 3:
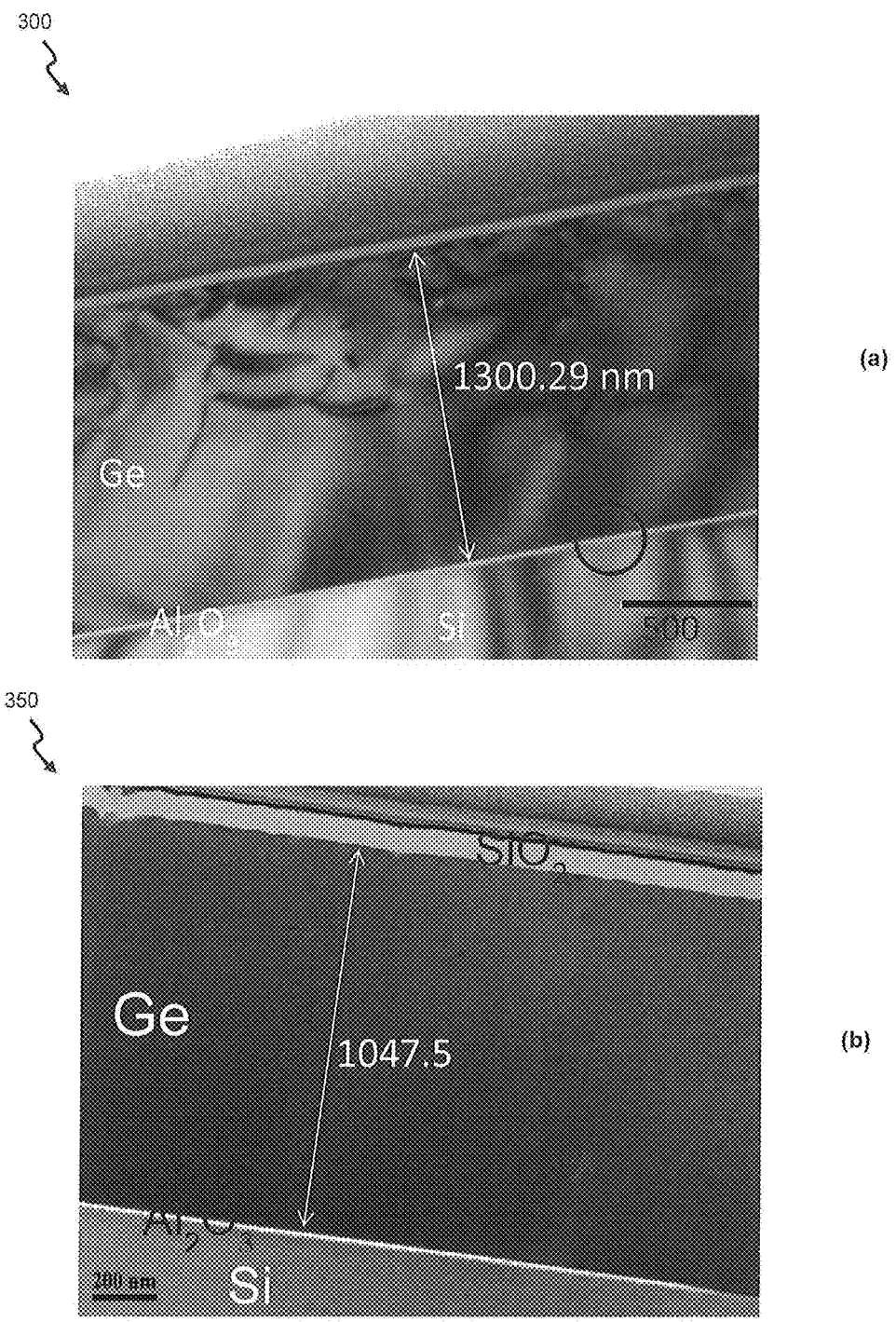
FIG. 3 includes FIGS. 3a and 3b, which are respective cross-sectional TEM bright field images of the GOI substrate prior and subsequent to annealing.

FIGS. 3a and 3b are respective cross-sectional TEM bright field images 300, 350 of the sample of the GOI substrate prior and subsequent to annealing. It is to be appreciated that FIG. 3a is identical to FIG. 2a, but included to contrast with FIG. 3b. From FIG. 3b, it clearly shows that a thickness of the germanium layer 112 is reduced by about 300 nm (from 1300.29 nm to 1047.50 nm) after annealing using oxygen, primarily due to the oxidation of a top layer of the germanium layer 112, which is then subsequently removed using hydrofluoric acid. More importantly, the misfit dislocations (previously hidden in the germanium layer 112 are substantially removed and the threading dislocations are reduced as compared to the situation in FIG. 3a.

Figure 4:
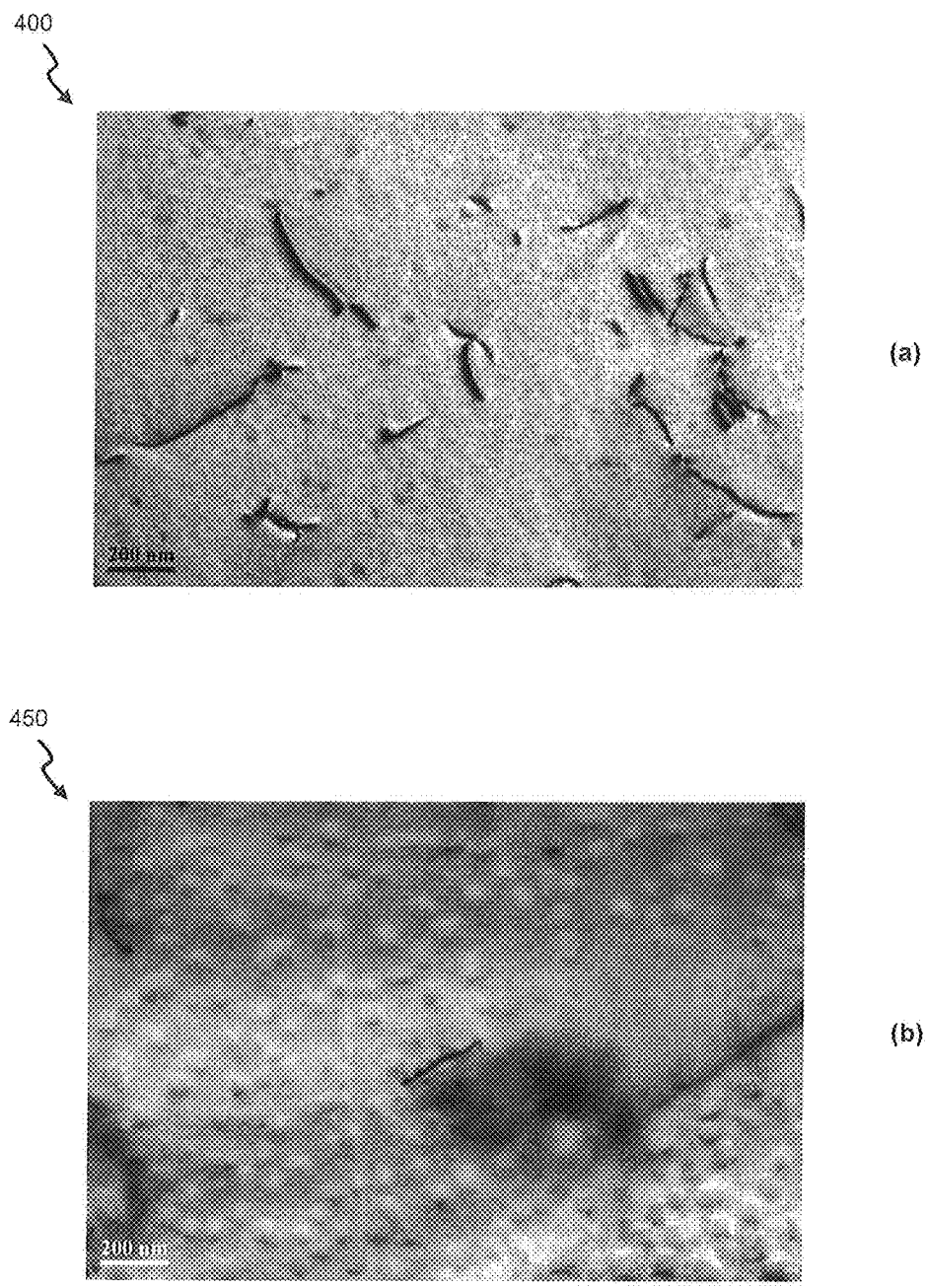
FIG. 4 includes FIGS. 4a and 4b, which are respective plan-view TEM images showing the threading dislocations on the surface of the germanium layer of the GOI substrate prior to annealing and subsequent to annealing, where the annealing is performed using oxygen at a temperature of 850° C. for about four hours.

The TDD may be determined from a plan-view TEM by estimating a number of dislocations in a given area at a number of locations across given samples of the GOI substrate, as shown in FIG. 4. FIG. 4 includes FIGS. 4a and 4b, which are respective TEM images 400, 450 showing the threading dislocations on the exposed surface of the germanium layer 112 of the GOI substrate prior to annealing and subsequent to annealing, where the annealing is performed using oxygen at a temperature of 850° C. for about three hours. Particularly, from FIGS. 4a and 4b, the estimated TDD is about $7.69 \pm 0.583 \times 10^8$ $cm^{-2}$ and $6.41 \pm 0.548 \times 10^7$ cm$^{-2}$ prior and subsequent to annealing, respectively. It is to be appreciated that due to a limitation of TEM, obtaining an image with a smaller magnification is not possible. Hence, there is a possibility that the above estimated figures for the TDD value may be over-estimated.

Figure 5:
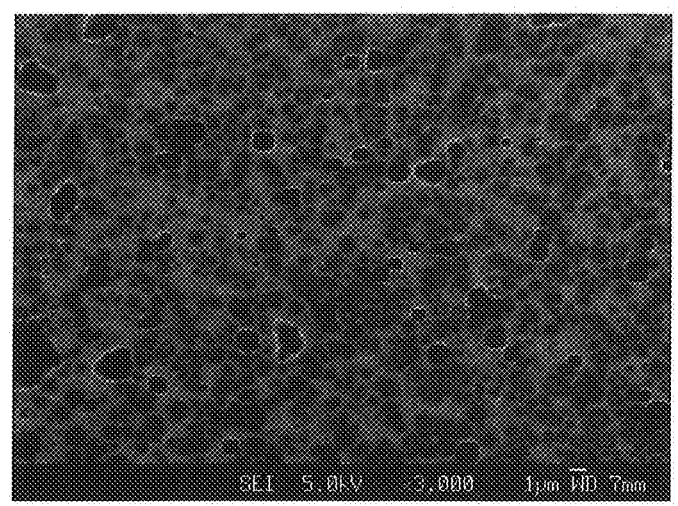
FIG. 5 includes FIGS. 5a and 5b, which are respective plan-view Scanning-Electron-Microscopy (SEM) images of estimated etch pit density (EPD) of the GOI substrate prior and subsequent to annealing.
Figure 5:
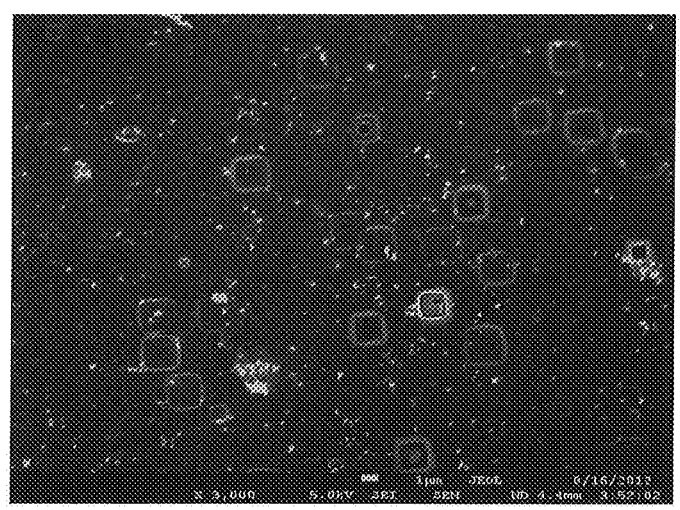

Therefore, to quantify the TDD with lower magnification images, the Field-Emission-Scanning-Electron-Microscope (FESEM) may be used instead. A sample of the GOI substrate is etched in iodine solution for about one second, before being investigated using the FESEM. Since misfit dislocations are etched much faster in the etchant, any resulting etch pit(s) are thus observable and detectable by the FESEM. Accordingly, as depicted in respective plan-view Scanning-Electron-Microscopy (SEM) images 500, 550 of FIGS. 5a and 5b, an estimated etch pit density (EPD) of the sample before and after being subjected to annealing in oxygen at 850° C. for about four hours is about $5.2\pm0.45\times10^8$ cm$^{-2}$ and $2.5\pm0.4\times10^6$ cm$^{-2}$, respectively. Thus, it is clear from FIGS. 5a and 5b that the EPD of the sample is reduced by at least two-orders of magnitude post-annealing, as opposed to pre-annealing.

Figure 6:
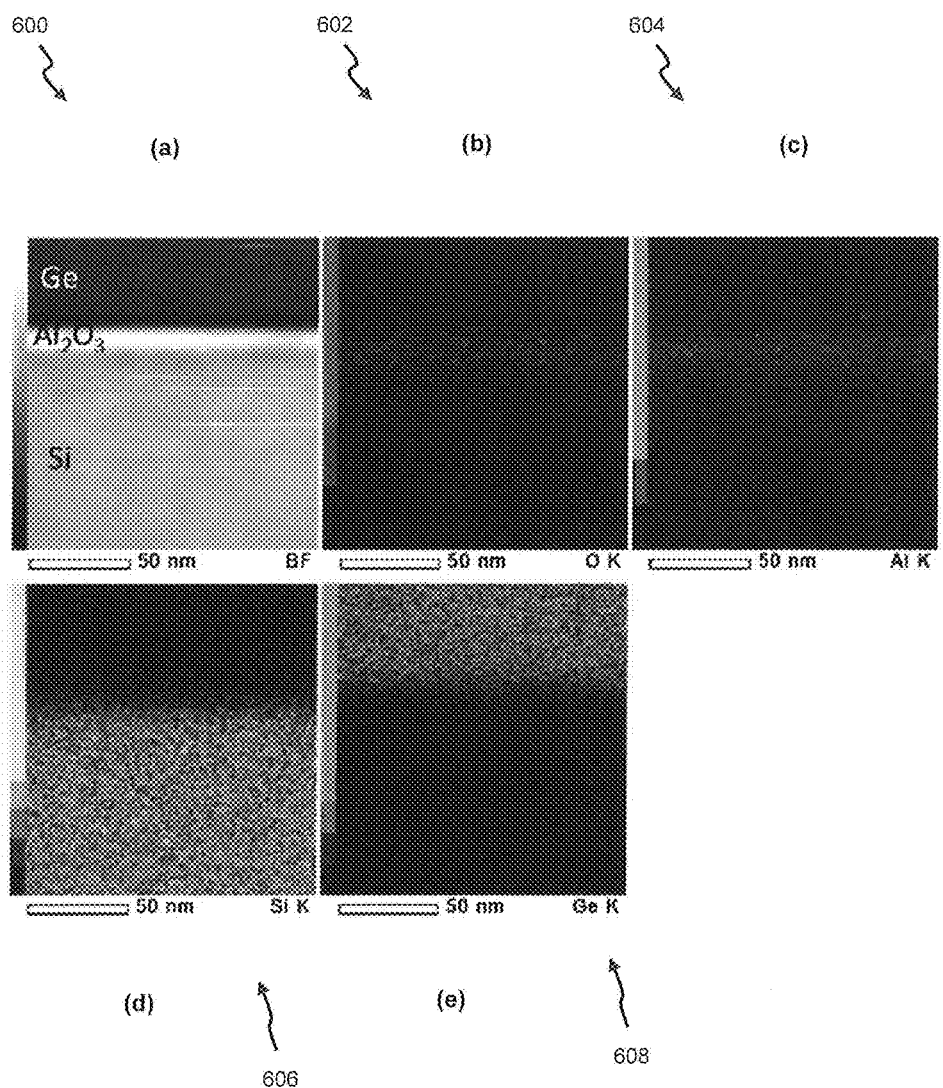
FIG. 6 includes FIGS. 6a to 6e, which are respective images showing EDX profile mapping performed on the GOI substrate subsequent to annealing, wherein different colours in the photographs highlight different elements detected in the GOI substrate.

FIGS. 6a to 6e are respective images 600, 602, 604, 606, 608 showing performance of EDX profile mapping on the GOI substrate subsequent to annealing, wherein different colours in the images 600, 602, 604, 606, 608 depict the different elements detected. Specifically, FIG. 6a is an SEM image 600, while FIGS. 6b to 6e are computer generated plots 602, 604, 606, 608. As shown, aluminium is detected to be mainly confined to the bonded Al$_2$O$_3$ layer without significant observable diffusion to the adjacent germanium layer 112, and the first and second semiconductor substrates 108, 110.

Figure 7:
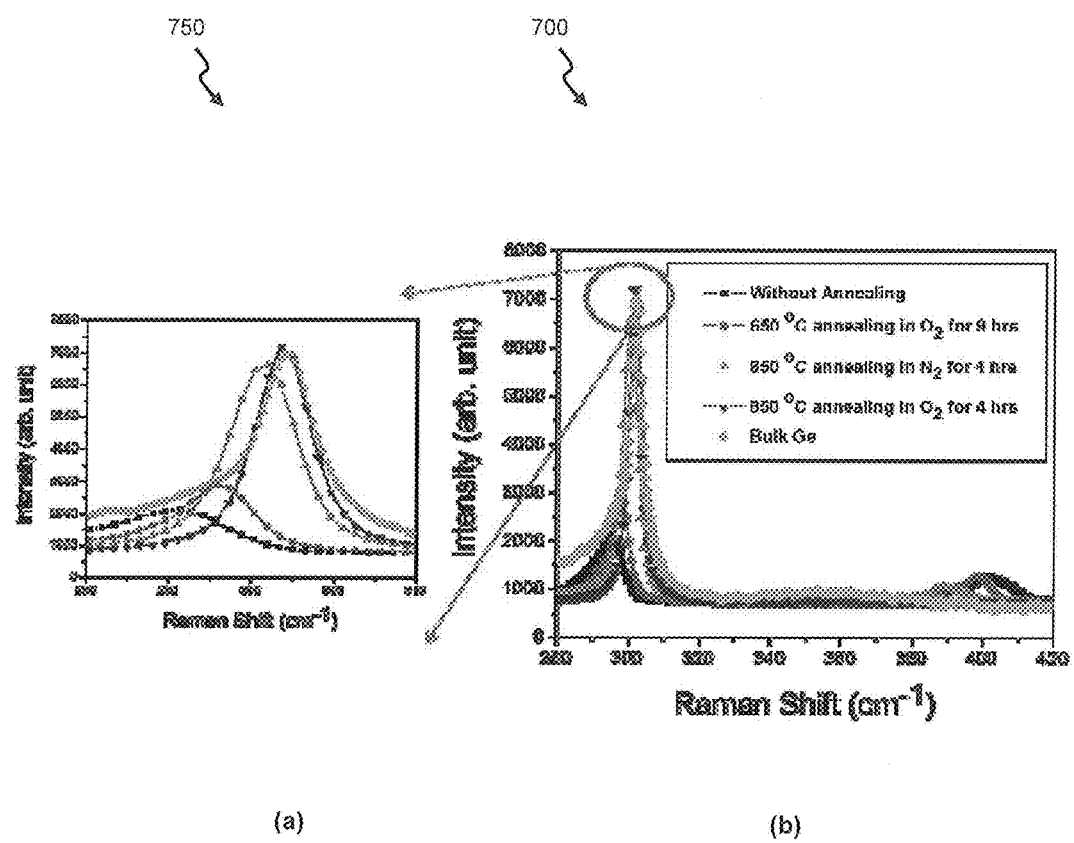

FIGS. 7a and 7b are respectively an image 700 of Raman spectroscopy of the alloy composition and the strain of the germanium epilayers on the GOI substrate prior and subsequent to annealing (using oxygen) with reference to bulk germanium, and an enlarged image 750 of the Ge—Ge vibration peak in FIG. 7a. To clarify, bulk germanium refers to a germanium wafer/germanium material obtained from growing germanium (bulk) crystal from a melt, which generally represents the highest quality Ge obtainable, since the crystal growth occurs using a high quality germanium seed crystal. Particularly, Raman spectroscopy is used in this instance to determine a strain level of the germanium layer 112. From FIG. 7a, it may be seen that no signal is observed to originate from the Si—Ge vibration mode after annealing, which indicates that the silicon from the intermixed silicon/germanium layer has been removed. Also, in FIG. 7a, a red shift of Ge—Ge vibration peak position is clearly observable from 295.58 cm$^{-1}$ (without annealing) to 301.72 cm$^{-1}$ (after annealing). From FIG. 7a, it is to be appreciated that the Ge—Ge vibration peak for the GOI substrate after annealing is substantially close to the bulk germanium reference (i.e. a peak at 301.09 cm$^{-1}$), indicating the germanium layer 112 of the GOI substrate is stress free.

Advantageously, the TDD of the GOI substrate manufactured using the proposed method 100 is measured to be about $2.5\times10^6$ cm$^{-2}$ which is at least an order of magnitude lower than conventional techniques used to grow similar germanium layers. In addition, the method 100 is scalable to manufacture wafers of any required size, which means that the method 100 is manufacturing worthy and may easily be integrated into existing manufacturing processes. The selection of Al$_2$O$_3$ as the bonding layer provides an enhancement to the thermal conductivity of the GOI substrate, but as mentioned, Al$_2$O$_3$ is merely one of many possible options that may be used as the dielectric material 114. Further advantages that are more generic to GOI substrates are that GOI substrates generally are immune to short channel effects, and enjoy lower parasitic capacitance and lower leakage of junction current. The proposed method 100 may find useful commercial applications in (for example): integrating III-V material on silicon via germanium/silicon or GOI substrate, manufacturing silicon-based photonics such as germanium lasers and/or detectors, manufacturing higher mobility channels for advanced CMOS and the like.

For discussion sake, a brief comparison between the proposed method 100 and some selected conventional techniques (i.e. Smart Cut™ method, Condensation method, Aspect Ratio Trapping method, and Graded Buffer method) are set out below. The Smart Cut™ method has an advantage of manufacturing germanium layers with low TDD since bulk germanium substrate is used as a donor wafer, but the Smart Cut™ method suffers from a wafer size limitation, in that it is impossible to use the Smart Cut™ method to manufacture wafer sizes greater than 200 mm. On the other hand, the Condensation method, and Aspect Ratio Trapping method suffer from respective drawbacks of causing high numbers of stacking faults (i.e. defects) when a percentage concentration of the germanium in the GOI substrate exceeds 82%, and requiring lithography to pattern silicon dioxide. The Graded Buffer method can be used to manufacture germanium layers with TDD of about $10^5$ cm$^{-2}$, but however is fairly time consuming in terms of actual operation and also is material wasting to grade 10 µm of silicon-germanium. For the proposed method 100, it beneficially enables germanium layers with TDD of about $10^6$ cm$^{-2}$ to be manufactured, is highly scalable compared to conventional techniques, and produces GOI substrates with higher thermal conductivity. One slight drawback of the proposed method 100 is that resulting germanium layers manufactured has higher TDD compared to germanium layers manufactured using the Smart Cut™ method.

While the invention has been illustrated and described in detail in the drawings and foregoing description, such illustration and description are to be considered illustrative or exemplary, and not restrictive; the invention is not limited to the disclosed embodiments. Other variations to the disclosed embodiments can be understood and effected by those skilled in the art in practising the claimed invention.

For example, the dielectric material 114 may instead be deposited only on the first or second semiconductor substrate 108, 110, and step 102 (of bonding) may still be performed, accordingly to the above described to similarly provide the combined substrate 116. Yet further, it is not necessary that a same dielectric material be used for the dielectric material 114; for example, a first dielectric material may be deposited on the first semiconductor substrate 108, and a second dielectric material may be deposited on the second semiconductor substrate 110, and step 102 is still performed as per above described. It is to be appreciated that the first dielectric material is different to the second dielectric material. Moreover, it is not necessary only a dielectric/insulating material be used as the dielectric material 114; indeed other suitable bonding materials (e.g. metal) may alternatively be used in place of the dielectric material 114. For example, for the first semiconductor substrate 108, the deposited dielectric material 114 is capped using a first metallic material, while for the second semiconductor substrate 110, the germanium layer 112 is capped using a second metallic material, and then in step 102, the bonding is achieved by bringing into contact the first and second metallic materials respectively of the first and second semiconductor substrates 108, 110 to provide the combined substrate 116. In such instances, the final substrate 120, after step 106 has been completed, is then no longer termed as a GOI substrate, but just simply a germanium-based substrate.

Further, another dielectric layer (e.g. $SiO_2$) may also optionally be deposited on the first surface of the germanium layer 112, after the second semiconductor substrate 110 is removed from the combined substrate 116 at step 104. Specifically, the deposited dielectric layer on the germanium layer 112 may have an effect of slowing the consumption rate of the germanium layer 112 during the annealing (e.g. through oxidation). This is especially important in cases where the germanium layer 112 originally grown on the second semiconductor substrate 110 is fairly thin, or that the silicon-germanium (SiGe) is removed or did not form in the growth process.

The invention claimed is:

1. A method of manufacturing a germanium-on-insulator substrate, comprising:
   (i) providing a first semiconductor substrate, and a second semiconductor substrate formed with a germanium layer;
   (ii) bonding the first semiconductor substrate to the second semiconductor substrate using at least one dielectric material to form a combined substrate, the germanium layer being arranged intermediate the first and second semiconductor substrates;
   (iii) removing the second semiconductor substrate from the combined substrate to expose at least a portion of the germanium layer with misfit dislocations; and
   (iv) annealing the combined substrate to enable removal of the misfit dislocations from the portion of the germanium layer; and
   (v) etching the combined substrate to remove a layer of material formed on the portion of the germanium layer as a result of the annealing to enable removal of the misfit dislocations from the portion of the germanium layer,
   wherein the layer of material substantially includes the misfit dislocations.

2. The method of claim 1, further comprising depositing the at least one dielectric material respectively to the first and second semiconductor substrates prior to the bonding, wherein the at least one dielectric material is deposited on the germanium layer for the second semiconductor substrate.

3. The method of claim 2, wherein the at least one dielectric material includes at least first and second dielectric materials, the first dielectric material being deposited on the first semiconductor substrate, and the second dielectric material being deposited on the germanium layer for the second semiconductor substrate, and wherein the first dielectric material is different to the second dielectric material.

4. The method of claim 1, wherein prior to the bonding, further comprising:
   performing plasma activation on the first and second semiconductor substrates;
   washing the first and second semiconductor substrates with a deionized fluid; and
   drying the washed first and second semiconductor substrates.

5. The method of claim 1, wherein prior to removing the second semiconductor substrate from the combined substrate, further comprising annealing the combined substrate to increase the bonding between the first and second semiconductor substrates.

6. The method of claim 5, wherein annealing the combined substrate to increase the bonding includes performing the annealing using nitrogen at a temperature of about 300° C. and at atmospheric pressure.

7. The method of claim 1, wherein the at least one dielectric material is selected from the group consisting of aluminium oxide, aluminium nitrate, silicon dioxide, synthetic diamond and boron nitride.

8. The method of claim 1, wherein the first and second semiconductor substrates are respectively formed from silicon-based materials.

9. The method of claim 1, wherein the annealing is performed at a temperature between about 500° C. to 850° C.

10. The method of claim 1, further comprising:
    depositing a layer of protective material on the first semiconductor substrate, prior to removing the second semiconductor substrate from the combined substrate.

11. The method of claim 10, further comprising removing the protective material from the first semiconductor substrate using oxygen plasma configured with a power of about 800 W.

12. The method of claim 1, wherein etching the combined substrate includes wet etching using an etchant to remove the layer of material formed on the portion of the germanium layer, and the etchant includes hydrofluoric acid.

13. The method of claim 1, wherein removing the second semiconductor substrate from the combined substrate comprises:
    arranging the combined substrate to be in a solution of tetramethylammonium hydroxide to remove the second semiconductor substrate; and
    performing an etch-stopping on the exposed portion of the germanium layer.

14. The method of claim 13, wherein the solution is heated to a temperature of about 80° C.

15. The method of claim 1, wherein removing the second semiconductor substrate from the combined substrate comprises using a combination of mechanical grinding and wet etching to remove the second semiconductor substrate.

16. The method of claim 1, further comprising depositing the germanium layer on the second semiconductor substrate, prior to the bonding.

17. A method of manufacturing a germanium-on-insulator substrate, comprising:
    (i) providing a first semiconductor substrate, and a second semiconductor substrate formed with a germanium layer;
    (ii) bonding the first semiconductor substrate to the second semiconductor substrate using at least one dielectric material to form a combined substrate, the germanium layer being arranged intermediate the first and second semiconductor substrates;
    (iii) removing the second semiconductor substrate from the combined substrate to expose at least a portion of the germanium layer with misfit dislocations;
    (iv) annealing the combined substrate to enable removal of the misfit dislocations from the portion of the germanium layer, wherein the method further comprises forming a further dielectric material on the portion of the germanium layer, subsequent to removing the second semiconductor substrate, and prior to annealing the combined substrate.

18. A method of manufacturing a germanium-based substrate, comprising:

(i) providing a first semiconductor substrate, and a second semiconductor substrate formed with a germanium layer;
(ii) bonding the first semiconductor substrate to the second semiconductor substrate using at least one bonding material to form a combined substrate, the germanium layer being arranged intermediate the first and second semiconductor substrates;
(iii) removing the second semiconductor substrate from the combined substrate to expose at least a portion of the germanium layer with misfit dislocations; and
(iv) annealing the combined substrate to enable removal of the misfit dislocations from the portion of the germanium layer; and
(v) etching the combined substrate to remove a layer of material formed on the portion of the germanium layer as a result of the annealing to enable removal of the misfit dislocations from the portion of the germanium layer,
wherein the layer of material substantially includes the misfit dislocations.

19. The method of claim 18, wherein the bonding material includes a dielectric material, a non-dielectric material, a plurality of different non-dielectric materials, or a plurality of different dielectric materials.

* * * * *